US010389338B2

(12) United States Patent
Nakamizo et al.

(10) Patent No.: US 10,389,338 B2
(45) Date of Patent: Aug. 20, 2019

(54) PULSE SHIFT CIRCUIT AND FREQUENCY SYNTHESIZER

(71) Applicant: MITSUBISHI ELECTRIC CORPORATION, Tokyo (JP)

(72) Inventors: Hideyuki Nakamizo, Tokyo (JP); Morishige Hieda, Tokyo (JP); Hiroyuki Mizutani, Tokyo (JP); Kenichi Tajima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/077,396

(22) PCT Filed: Feb. 20, 2017

(86) PCT No.: PCT/JP2017/006059
§ 371 (c)(1),
(2) Date: Aug. 10, 2018

(87) PCT Pub. No.: WO2017/154532
PCT Pub. Date: Sep. 14, 2017

(65) Prior Publication Data
US 2019/0052252 A1 Feb. 14, 2019

(30) Foreign Application Priority Data

Mar. 9, 2016 (WO) .................. PCT/JP2016/057291

(51) Int. Cl.
*H03K 5/01* (2006.01)
*H03L 7/23* (2006.01)
(Continued)

(52) U.S. Cl.
CPC ............. *H03K 5/01* (2013.01); *H03L 7/1976* (2013.01); *H03L 7/23* (2013.01);
(Continued)

(58) Field of Classification Search
CPC ........... H03K 5/01; H03K 2005/00013; H03K 2005/00286
(Continued)

(56) References Cited

U.S. PATENT DOCUMENTS

2013/0257485 A1* 10/2013 Nikaeen ................. H03B 21/00
327/107

OTHER PUBLICATIONS

International Search Report for PCT/JP2017/006059 (PCT/ISA/210) dated Apr. 4, 2017.
(Continued)

*Primary Examiner* — John W Poos
(74) *Attorney, Agent, or Firm* — Birch, Stewart, Kolasch & Birch, LLP

(57) ABSTRACT

A problem with conventional distortion pulse shift circuits is that the output timing of a pulse signal cannot be controlled unless a reset signal is used. A pulse shift circuit according to the present invention includes: an integrator to integrate, for every clock, the first signal to be inputted; a quantizer to receive the second signal and to output a pulse signal when an integrated value of the integrator becomes equal to or larger than a signal value of the second signal; a delay circuit to delay the pulse signal; a converter disposed before or after the delay circuit to convert a signal value of the pulse signal into the signal value of the second signal; a subtractor to subtract the signal value of the pulse signal converted by the converter, from the signal value of the first signal to be inputted to the integrator; and an input signal control circuit to receive a third signal, to be disposed before the integrator, and to add a signal value corresponding to the third signal to the first signal to be inputted to the integrator or to block the first signal from being inputted to the integrator for clocks corresponding to the third signal.

5 Claims, 12 Drawing Sheets

(51) Int. Cl.
    *H03L 7/197*      (2006.01)
    *H03K 5/00*       (2006.01)
    *H03M 7/32*       (2006.01)
(52) U.S. Cl.
    CPC .............. *H03K 2005/00013* (2013.01); *H03K 2005/00286* (2013.01); *H03M 7/3028* (2013.01)
(58) Field of Classification Search
    USPC ................................................ 327/105, 107
    See application file for complete search history.

(56) References Cited

OTHER PUBLICATIONS

Miller et al., "A Multiple Modulator Fractional Divider", IEEE Transactions on Instrumentation and Measurement, vol. 40, No. 3, June 1991, pp. 578-583.
Riley et al., "Delta-Sigma Modulation in Fractional-N Frequency Synthesis", IEEE Journal of Solid-State Circuits, vol. 28, No. 5, May 1993, pp. 553-559.
Tajima et al., "Novel Phase Difference Control Between Output Signals Using Fractional-N PLL Synthesizers by Cyclic Shift Of Control Data", IEEE IMS2007, pp. 835-838.

* cited by examiner

PULSE SHIFT CIRCUIT AND FREQUENCY SYNTHESIZER

TECHNICAL FIELD

The present invention relates to a pulse shift circuit.

BACKGROUND ART

A fractional-N PLL (Phase Locked Loop) can lock the PLL with a division number after the decimal point by controlling the division number of the divider using a frequency division number control signal generated by a $\Delta\Sigma$ modulator.

Further, in a case where two fractional-N PLLs each having the same configuration are placed in parallel and each receive the same reference signal, by shifting one of division number control signals generated by the $\Delta\Sigma$ modulator, by the clock unit, to the other, a phase difference can be given between output signals of the two PLLs in accordance with the shift amount.

A pulse shift circuit disclosed in Non-patent Document 1 is known as a circuit to shift a frequency division number control signal generated by a $\Delta\Sigma$ modulator by the clock unit.

The conventional pulse shift circuit outputs a pulse signal at a timing shifted by the number of clocks intended with respect to a pulse signal outputted by a reference pulse circuit. The shift amount is determined by the clock difference between a reset signal to the reference pulse circuit and a reset signal to the pulse shift circuit. In other words, the conventional pulse shift circuit shifts the output timing of the pulse signal by shifting the reset timing of the pulse shift circuit with respect to the reset timing of the reference pulse circuit by the number of clocks corresponding to the shift amount. The reset signals are signals to return the internal devices of the pulse shift circuit or the reference pulse circuit to their initial value states.

In the conventional pulse shift circuit, because operation start timing after resetting the pulse shift circuit is delayed by the intended number of clocks with respect to operation start time after resetting the reference pulse circuit, the pulse signal outputted by the pulse shift circuit is outputted at a shifted timing by the intended number of clocks with respect to the pulse signal outputted by the reference pulse circuit.

PRIOR ART DOCUMENTS

Non Patent Document

Kenichi TAJIMA, Ryoji HAYASHI: "Novel Phase Difference Control Between Output Signals Using Fractional-N PLL Synthesizers by Cyclic Shift of Control Data" IEEE IMS2007

SUMMARY OF THE INVENTION

Problems to be Solved by the Invention

In the conventional pulse shift circuit, however, because the output timing of a pulse signal is controlled by the clock difference between the reset signal of the reference pulse circuit and the reset signal of the pulse shift circuit, it is always necessary to reset both of the reference pulse circuit and the pulse shift circuit when the output timing is to be changed. When both of the circuits are reset, both of the PLL connected to the reference pulse circuit and the PLL connected to the pulse shift circuit are temporarily unlocked, and thereby the two PLLs cannot be used until they are locked again. A PLL is normally used as a local oscillator of an RF circuit in a communication device, etc., and when it is unlocked, intended functions for the device cannot be achieved.

The purpose of the present invention is to provide a pulse shift circuit capable of controlling an output timing of a pulse signal without using the reset signal.

Means for Solving Problem

A pulse shift circuit according to the present invention includes an integrator to integrate, for every clock, the first signal to be inputted, a quantizer to receive the second signal and to output a pulse signal when an integrated value of the integrator becomes equal to or larger than a signal value of the second signal, a delay circuit to delay the pulse signal, a converter disposed before or after the delay circuit to convert a signal value of the pulse signal into the signal value of the second signal, a subtractor to subtract the signal value of the pulse signal converted by the converter, from the signal value of the first signal to be inputted to the integrator, and an input signal control circuit to receive a third signal, to be disposed before the integrator, and to add a signal value corresponding to the third signal to the first signal to be inputted to the integrator or to block the first signal from being inputted to the integrator for clocks corresponding to the third signal.

Effects of the Invention

According to the present invention, it will become possible to control an output timing of a pulse signal without using the reset signal.

EMBODIMENTS FOR CARRYING OUT THE INVENTION

Embodiment 1

Figure 1:
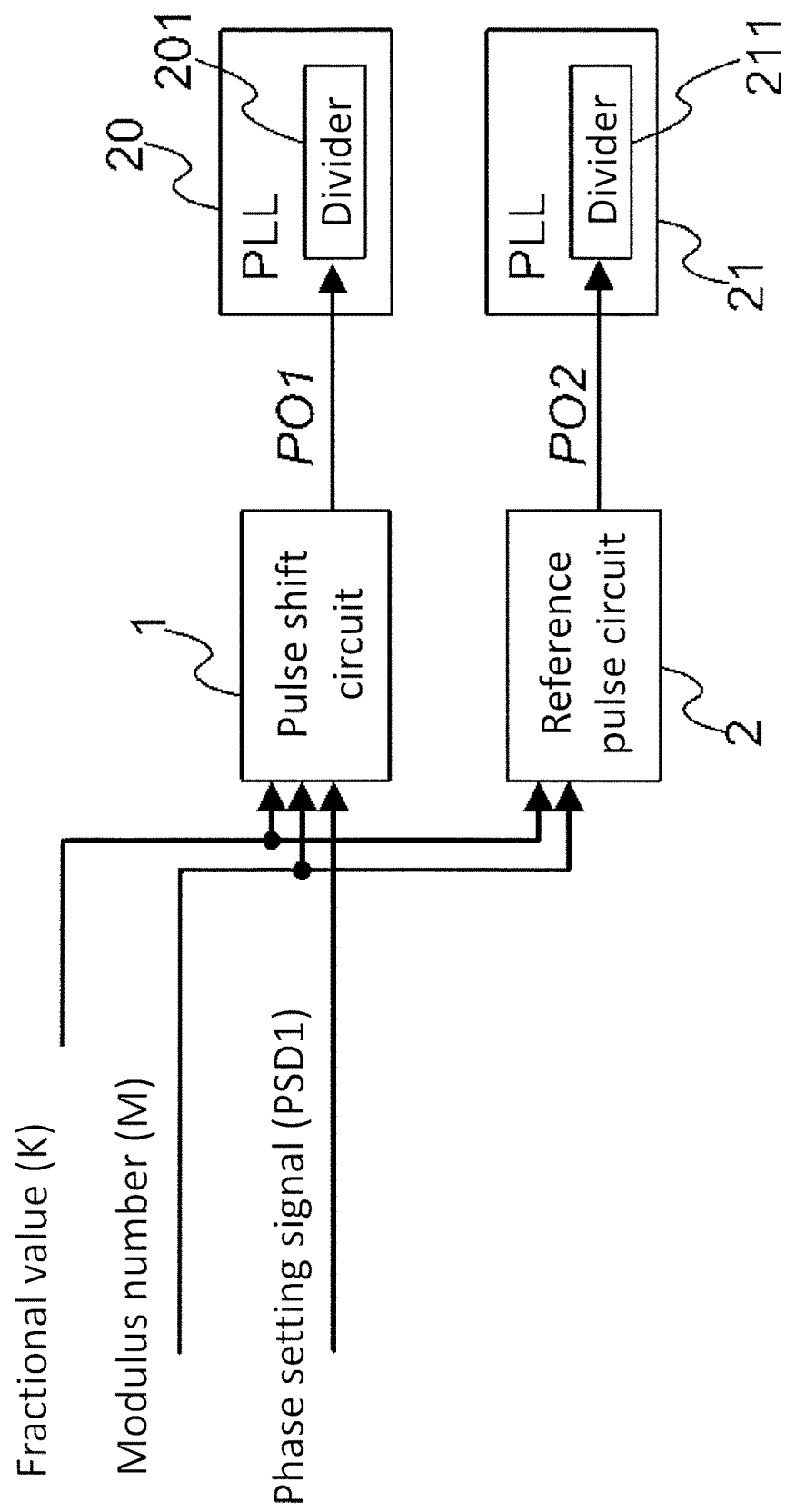
FIG. 1 is a diagram showing an example of use of a pulse shift circuit according to Embodiment 1 of the present invention.

FIG. 1 is a diagram showing an example of use of a pulse shift circuit according to Embodiment 1 of the present invention. In FIG. 1, a pulse shift circuit 1, a PLL 20, a reference pulse circuit 2, and a PLL 21 constitute a frequency synthesizer which can control the phase difference between the output signals of the two PLLs. The pulse shift circuit 1 is connected to a divider 201 built in the PLL 20. The reference pulse circuit 2 is connected to a divider 211 built in the PLL 21. K (an example of a first signal) is frequency setting data, which is generally called a fractional value. M (an example of a second signal) is frequency setting data, which is generally called a modulus number. PO1 and PO2 are respectively frequency division number control signals of the divider 201 and the divider 211, which are pulse signals outputted at a period of M/K. The values after the decimal point in the division numbers of the PLL 20 and the PLL 21 are set by K/M. The PLL 20 and the PLL 21 lock signals by the use of the set division numbers and output signals. To make explanation be more understandable, K and M are assumed to be numbers where K/M is irreducible. For example, K/M takes the same value in cases when K=1 and M=10 and when K=2 and M=20, and being irreducible means the case when K=1 and M=10.

Figure 2:
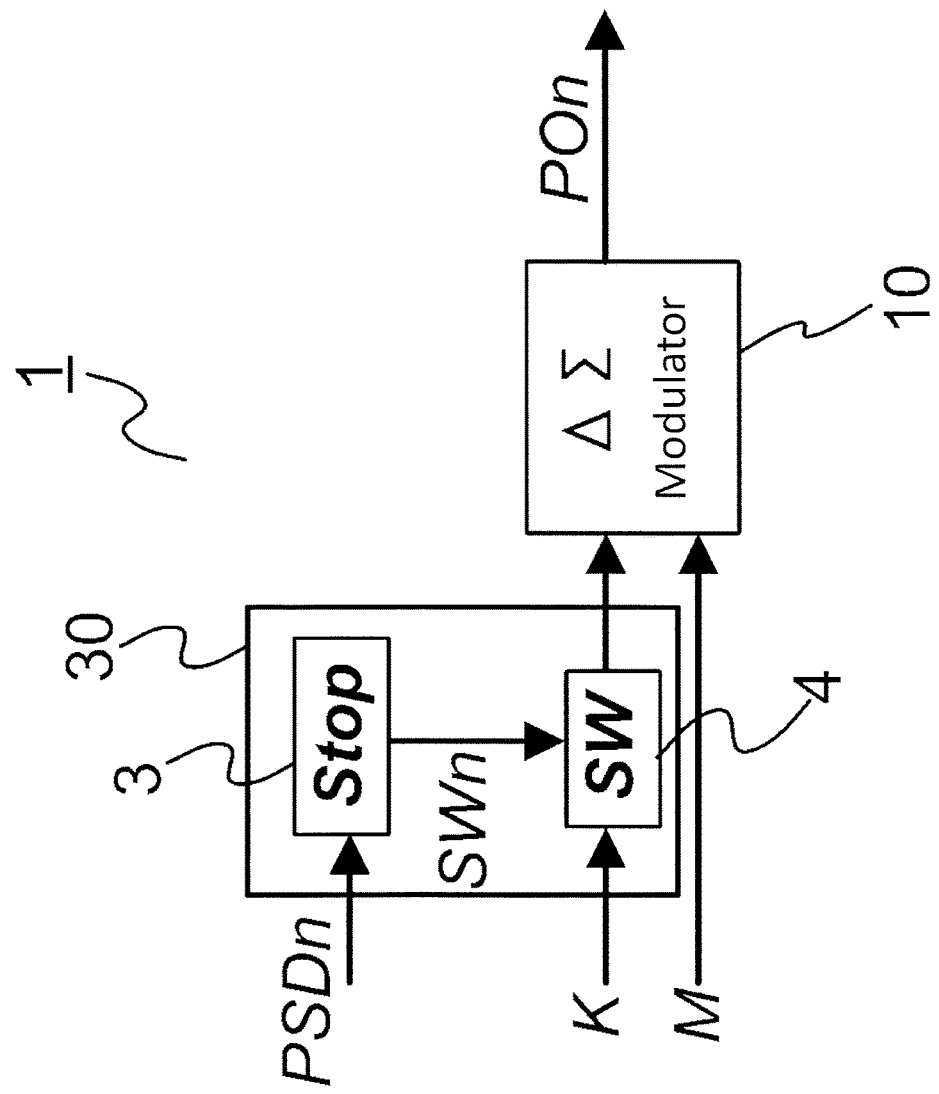
FIG. 2 is a diagram showing a configuration example of the pulse shift circuit 1 according to Embodiment 1 of the present invention.

FIG. 2 is a diagram showing a configuration example of the pulse shift circuit 1 according to Embodiment 1 of the present invention. The pulse shift circuit 1 includes an input signal control circuit 30 and a ΔΣ modulator 10.

The input signal control circuit 30 is a control circuit to control whether to let an input signal pass as it is or to block it. The input signal control circuit 30 is connected to the ΔΣ modulator 10. The input signal control circuit 30 includes a switch control circuit 3 and a switch 4.

The switch control circuit 3 is a control circuit to control ON/OFF of the switch 4 according to an externally-inputted phase setting signal PSDn (an example of a third signal). The switch control circuit 3 is connected to the switch 4 and outputs a switch-off signal SWn to control ON/OFF of the switch 4. The switch control circuit 3 is, for example, constituted by a logic circuit using a field programmable gate array (FPGA) or an application specific integrated circuit (ASIC).

The switch 4 is a switch to switch ON/OFF according to a control signal of the switch control circuit 3. The switch 4 is connected to the switch control circuit 3 and the ΔΣ modulator 10. When the switch-off signal SWn has not been inputted from the switch control circuit 3 (SWn=0), the switch 4 outputs K inputted and kept intact, to the ΔΣ modulator 10. On the other hand, when the switch-off signal SWn has been inputted (SWn=1), the switch 4 outputs zero to the ΔΣ modulator 10. Zero means that no signal is inputted to the ΔΣ modulator. The switch 4, for example, is constituted by a logic circuit of a FPGA or an ASIC.

The reference pulse circuit 2 is a reference pulse circuit to output a reference pulse signal. The reference pulse signal has the same pulse period as the output signal of the pulse shift circuit 1. The reference pulse circuit 2 may have the same configuration as the pulse shift circuit 1 or may have another configuration. For the reference pulse circuit 2, for example, the ΔΣ modulator is used.

Figure 3:
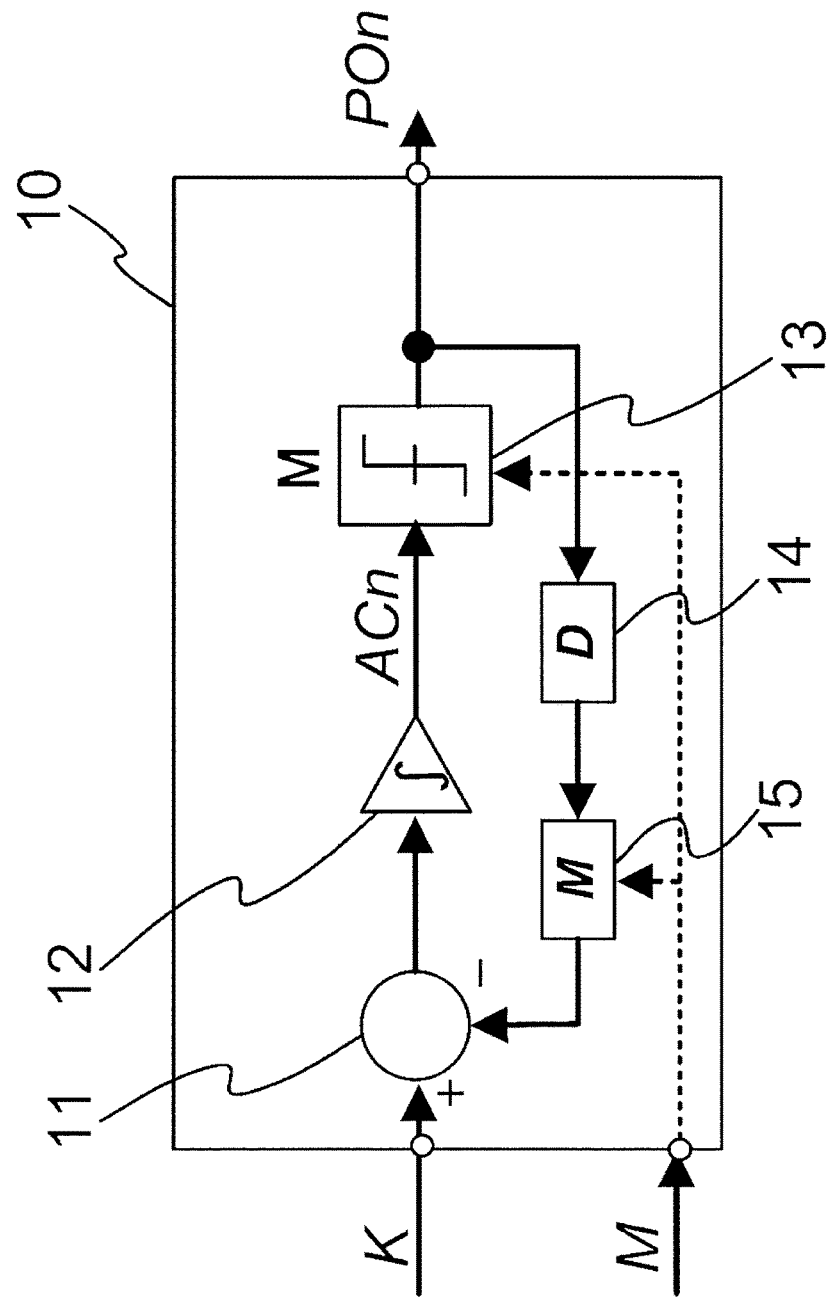
FIG. 3 is a diagram showing a configuration example of a $\Delta\Sigma$, modulator 10 according to Embodiment 1 of the present invention.

The ΔΣ modulator 10 is a ΔΣ modulator to which K and M are inputted and from which a frequency division number control signal (POn) is outputted. FIG. 3 is a diagram showing a configuration example of the ΔΣ modulator 10 according to Embodiment 1 of the present invention. The ΔΣ modulator 10 includes a subtractor 11, an integrator 12, a quantizer 13, a delay circuit 14, and a converter 15. For convenience of explanation, here, let the terminal receiving K be a first terminal, the terminal receiving M be a second terminal, and the terminal outputting POn be an output terminal. The subtractor 11 is a subtractor to subtract the output value of the converter 15 from the value of the frequency setting data K inputted to the first terminal of the ΔΣ modulator 10. The integrator 12 is an integrator to integrate the output value of the subtractor 11 for every clock. The initial value of the integrator 12 is the same as the initial value of the integrator built in the reference pulse circuit 2. Therefore, in the initial state, the timing at which the pulse shift circuit 1 outputs a pulse signal and the timing at which the reference pulse circuit 2 outputs a pulse signal are the same. The quantizer 13 is a quantizer to output POn (=1) to its output terminal when the output value ACn of the integrator 12 becomes equal to or larger than the value of frequency setting data M inputted to the second terminal of the ΔΣ modulator 10. The quantizer 13 outputs POn (=1) at the timing when ACn becomes equal to or larger than M. The delay circuit 14 is a delay circuit which holds the output value of the quantizer 13 for one clock to make a delay. The converter 15 is a converter to multiply the output value of the delay circuit 14 by M being the value of the frequency setting data M inputted to the second terminal of the ΔΣ modulator 10 and then output the resultant value. Note that the converter 15 may be constituted by a multiplier. The converter 15 and the delay circuit 14 may be placed in a reverse order.

The ΔΣ modulator 10 accumulates the K value for every clock and outputs POn (=1) when the accumulated signal ACn becomes equal to or larger than the value of M. POn is received by the subtractor 11 via the delay circuit 14 and the converter 15, and the subtractor 11 subtracts the output signal (M) of the converter 15 from K to be inputted. Then, the subtractor 11 outputs the subtracted signal (K-M) to the integrator 12. As the result, when the integral value of the integrator 12 becomes equal to or larger than M, the value of the integrator 12 becomes K at the next clock input time. In other words, the integrator 12 performs operation to integrate K for every clock, and to return the integral value to K by the output signal of the subtractor 11 when the integral value becomes equal to or larger than M. The quantizer 13 outputs POn (=1) when the integrated value of the integrator 12 becomes equal to or larger than M. As the result, the ΔΣ modulator 10 outputs POn (=1) at every M/K clock interval.

Next, operation of the pulse shift circuit 1 according to Embodiment 1 of the present invention will be described. Here, to make explanation be more understandable, the operation will be explained in comparison with the operation of the reference pulse circuit 2. The reference pulse circuit 2 has the same configuration as the pulse shift circuit 1 except that the switch control circuit 3 and the switch 4 are not included. Further, signal names correspond to those in the pulse shift circuit 1.

Figure 4:
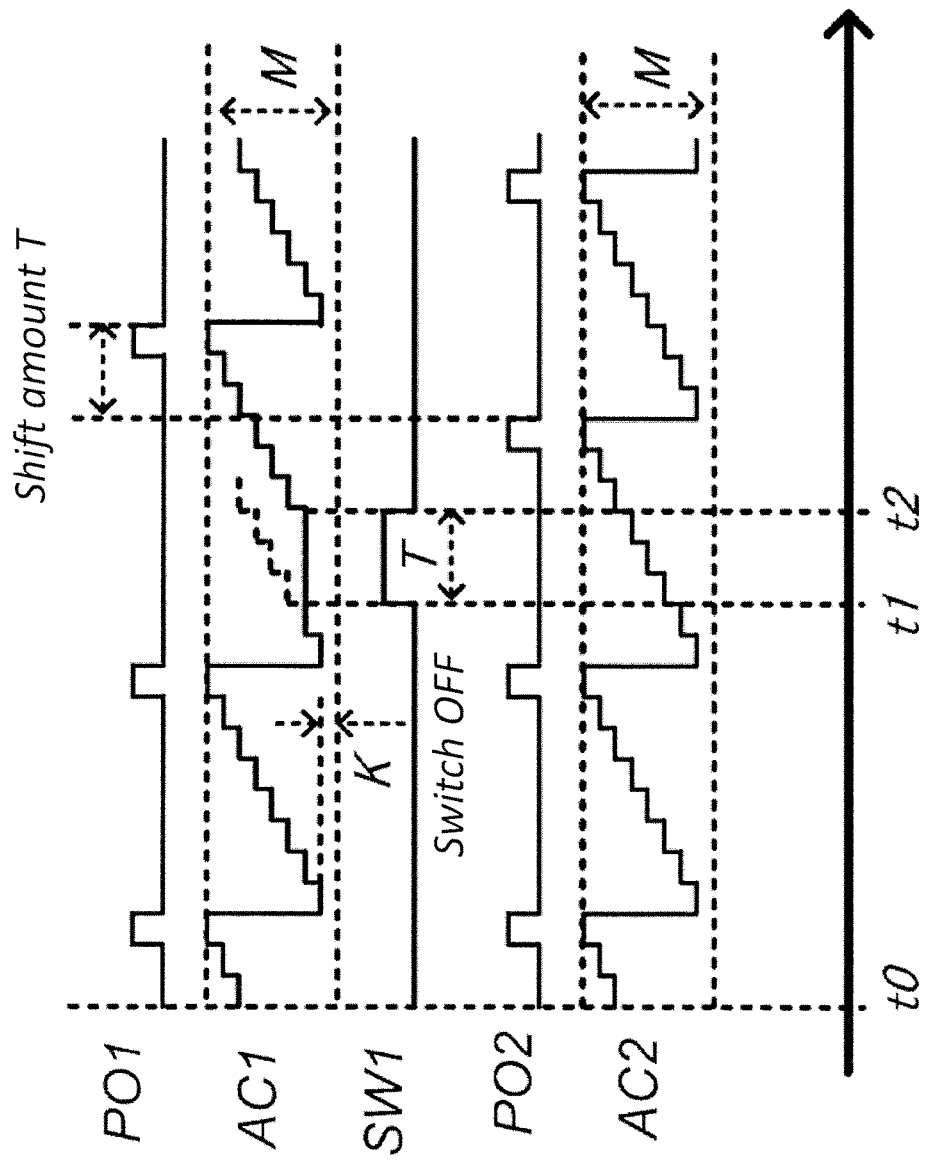
FIG. 4 is a time chart diagram showing a signal time chart of the pulse shift circuit according to Embodiment 1 of the present invention.

FIG. 4 is a time chart diagram showing a signal time chart of the pulse shift circuit 1 according to Embodiment 1 of the present invention. In FIG. 4, the horizontal axis represents time and the vertical axis represents signal value. PO1 is the pulse signal outputted by the pulse shift circuit 1, which is the frequency division number control signal. PO2 is the pulse signal outputted by the reference pulse circuit 2, which is the frequency division number control signal. AC1 is the output value of the integrator 12 in the pulse shift circuit 1. AC2 is the output value of the integrator in the reference pulse circuit 2. SW1 is the output value of the switch control circuit 3 in the pulse shift circuit 1. When it is one, the switch 4 is turned off and when it is zero, the switch is turned on.

In the section from time t0 to t1, the pulse shift circuit 1 increases the value of AC1 by the value of K for every clock and outputs PO1 (=1) when the value of ACn becomes equal to or larger than the value of M. As the result, the pulse shift circuit 1 outputs PO1 at every M/K clock interval. With the same operation as the pulse shift circuit 1, the reference pulse circuit 2 outputs PO2 at every M/K clock interval.

At the timing of t1, the switch control circuit 3 outputs a switch-off signal SW1 according to a shift amount setting signal (PSD1). For example, in FIG. 1, in the case when the relative phase of the output signal of the PLL 20 with respect to the output signal of the PLL 21 is to be delayed by X degrees, first, PSD1 is set to X. Then, on the basis of the set value, the switch control circuit 3 outputs the switch-off signal SW1 (=1) during X/K*M/360 (=T) clocks. By doing so, in FIG. 2, because the switch 4 blocks the input K during the T clocks, the value of AC1 will be constant during the T clocks.

Then, the switch control circuit 3 stops outputting the switch-off signal SW1 at the timing of t2 which is after T clocks from t1. By doing so, the switch 4 outputs K as it is, without blocking it, to the ΔΣ modulator 10. Therefore, in the section after t2, the value of AC1 increases by the value of K for every clock, and when the value of AC1 becomes equal to or larger than the value of M, PO1(=1) is outputted as a pulse signal.

As the result, the timing at which the pulse shift circuit 1 outputs PO1 shifts by T clocks with respect to the timing at which the reference pulse circuit 2 outputs PO2. Therefore, a phase difference of 360*T*K/M degrees is created between output signals of the PLL 20 and the PLL 21 in FIG. 1.

As shown in the time chart of FIG. 4, by using the pulse shift circuit 1, the output timing of the pulse of the pulse shift circuit 1 can be freely adjusted with respect to the output timing of the pulse of the reference pulse circuit 2. Thus, there is no need to reset the pulse shift circuit 1 and the reference pulse circuit 2.

As described above, according to the pulse shift circuit of Embodiment 1, because the switch 4 is turned off for the number of clocks corresponding to the shift amount setting signal (PSD1) with respect to the fractional value K, the timing at which PO1 is outputted can be shifted by the number of clocks. Therefore, the pulse timing can be freely adjusted without using a reset signal.

Note here that the configuration of the ΔΣ modulator 10 is not limited to what is shown in FIG. 3, but may be a multi-stage type ΔΣ modulator as shown by B. Miller and B. Conley in "A multiple modulator fractional divider", IEEE Transactions on Instrumentation and Measurement, Vol. 40, NO. 3, June 1991, or of a configuration of ΔΣ modulator as shown by Tom A. D. Riley, Miles A. Copeland, Tad A. Kwasniewski in "Delta-Sigma Modulation in Fractional-N Frequency Synthesis", IEEE Journal of Solid-State Circuits, Vol. 28, NO. 5, May 1993.

Figure 5:
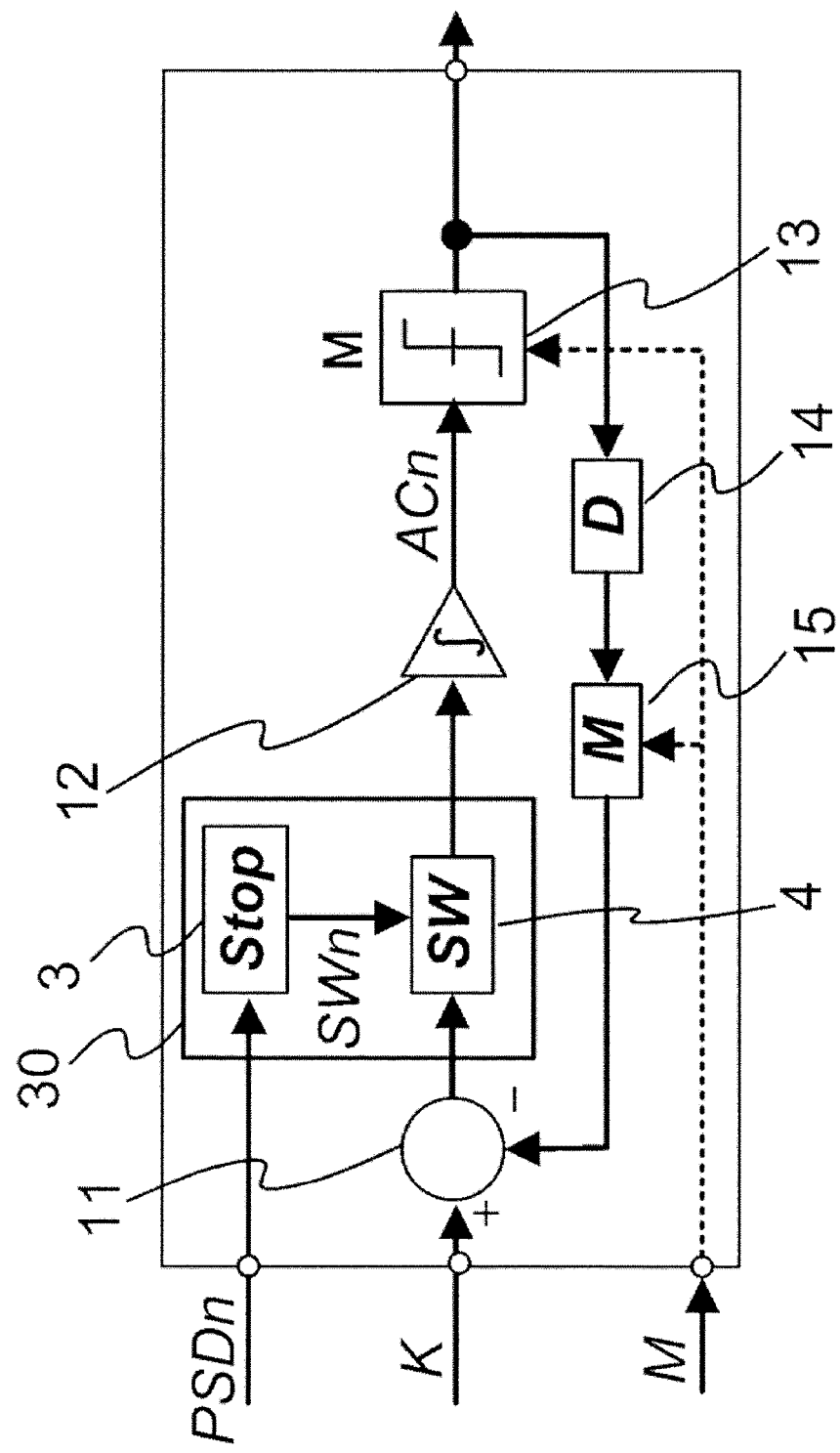
FIG. 5 is a diagram showing another configuration example of the pulse shift circuit according to Embodiment 1 of the present invention.

The switch control circuit 3 and the switch 4 may be provided inside the ΔΣ modulator 10. FIG. 5 is a diagram showing another configuration example of the pulse shift circuit according to Embodiment 1 of the present invention. The difference from the pulse shift circuit shown in FIG. 2 is that the switch control circuit 3 and the switch 4 are built in the ΔΣ modulator 10. Also in such a configuration shown in FIG. 5 in which the switch 4 is provided after the subtractor 11, because the switch 4 operates so as to block K to be inputted to the integrator 12, ACn is not increased during clocks in which the switch 4 is OFF, and as the result, the output timing of POn can be shifted by the clocks. Therefore, the pulse shift circuit with such a configuration as shown in FIG. 5 can also bring about the same effect as the pulse shift circuit shown in FIG. 2.

Although, here, the case of two circuits, namely the pulse shift circuit 1 and the reference pulse circuit 2, is shown, even in the case of more than two circuits, the pulse timing can be controlled to be freely shifted with respect to the reference pulse. Also, in doing so, it is not necessary to reset the reference pulse circuit 2.

Note here that if the pulse shift circuit 1 knows the output timing of the pulse signal of the reference pulse circuit 2 at the initial state, the output timing of the pulse signal of the pulse shift circuit 1 and the output timing of the pulse signal of the reference pulse circuit 2 do not need to be identical at the initial state. If the pulse shift circuit 1 knows the difference between the signal output timings of the both circuits at the initial state, the shift amount can be determined considering the difference, so that the shift amount can be controlled to shift by any amount.

Embodiment 2

In Embodiment 1, in a pulse shift circuit, a circuit configuration is shown which can achieve a shift of the frequency division number control signal (PO1) by keeping a signal to be inputted to the integrator 12 of the ΔΣ modulator 10 constant during several clocks according to the phase setting signal. Here, in a pulse shift circuit, a circuit configuration will be shown which can achieve, only in one clock, a shift of the frequency division number control signal. Thus, the circuit's operation time can be reduced, bringing about an effect in reduction of a circuit's power consumption.

Figure 6:
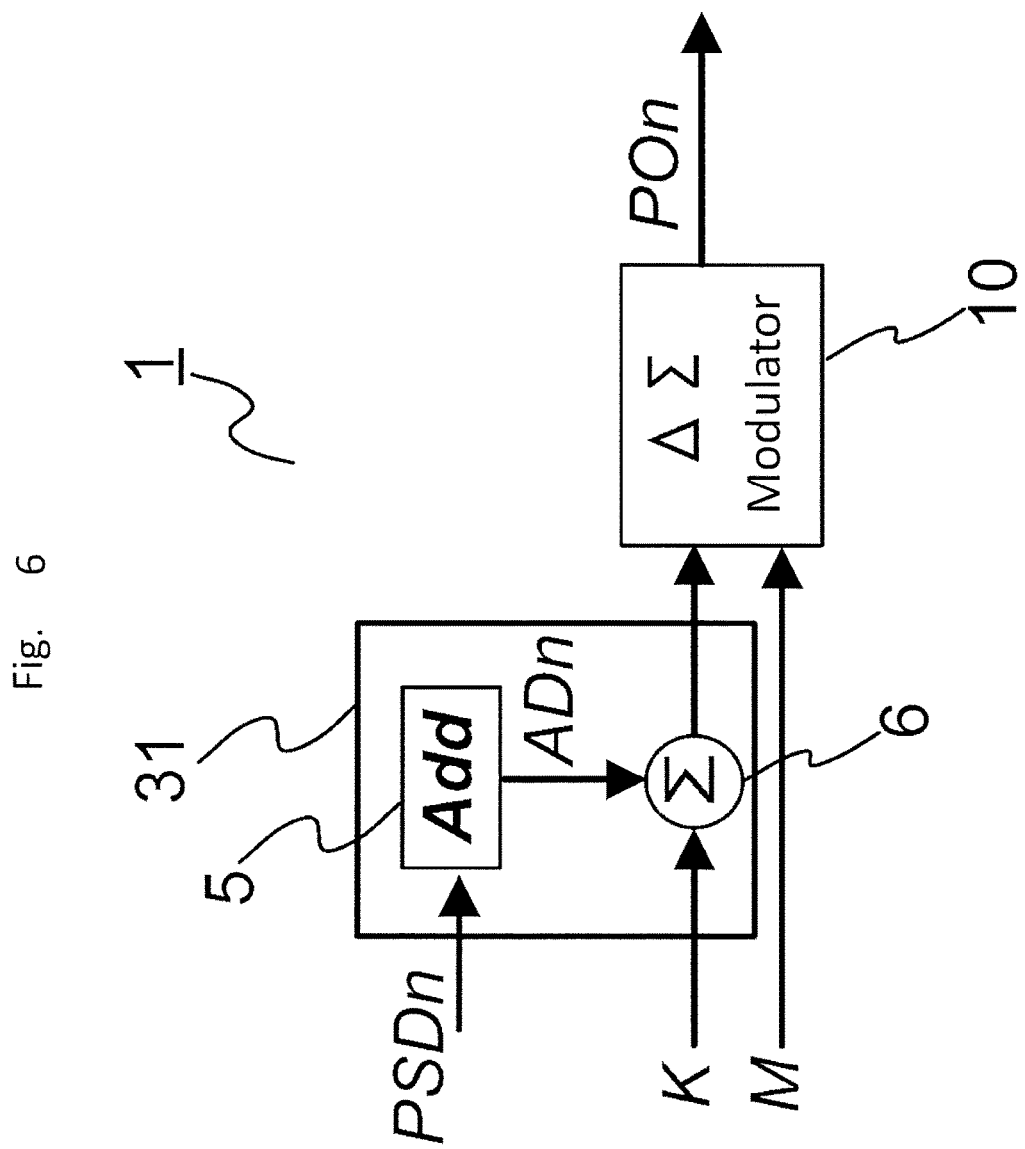
FIG. 6 is a diagram showing a configuration example of a pulse shift circuit according to Embodiment 2 of the present invention.

FIG. 6 is a diagram showing a configuration example of a pulse shift circuit according to Embodiment 2 of the present invention. The difference from the pulse shift circuit 1 according to Embodiment 1 is that an input signal control circuit 31 is constituted by an addition bit generating circuit 5 and an adder 6.

The addition bit generating circuit 5 is a circuit to generate an addition bit ADn according to the value of the phase setting signal (PSDn), and to output the generated ADn to the adder 6. For example, the addition bit generating circuit 5 is constituted by a logic circuit of FPGA or an ASIC. The adder 6 is an adder which adds the frequency setting data K and the addition bit ADn, and outputs the resultant signal (K+ADn) to the ΔΣ modulator 10. For example, the adder 6 is constituted by a logic circuit of FPGA or an ASIC.

Figure 7:
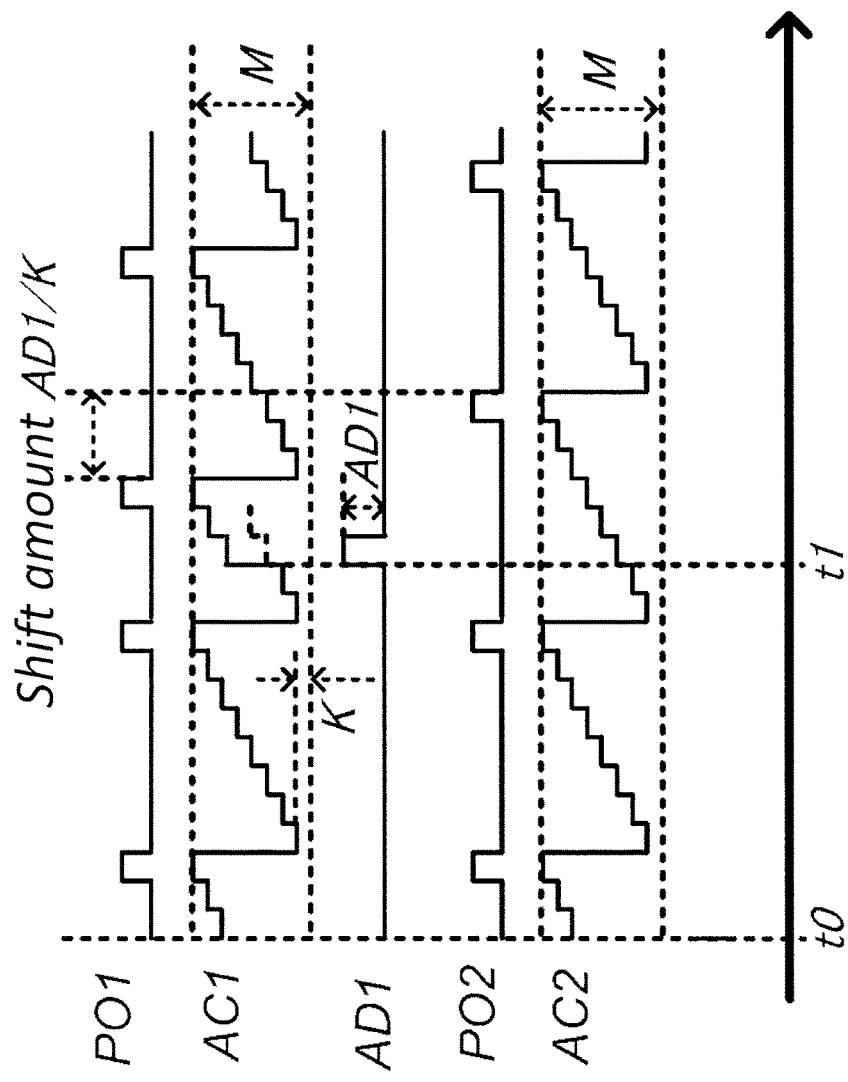
FIG. 7 is a time chart diagram showing a signal time chart of the pulse shift circuit according to Embodiment 2 of the present invention.

Next, operation of the pulse shift circuit according to Embodiment 2 will be described. FIG. 7 is a time chart diagram showing a signal time chart of the pulse shift circuit according to Embodiment 2 of the present invention. In FIG. 7, the horizontal axis represents time, and the vertical axis represents signal value. PO1 is the pulse signal outputted by the pulse shift circuit 1, which is the frequency division number control signal. PO2 is the pulse signal outputted by the reference pulse circuit 2, which is the frequency division number control signal. AC1 is an output value of the integrator 12 in the pulse shift circuit 1. AC2 is an output value of the integrator in the reference pulse circuit 2. AD1 is an output value of the addition bit generating circuit 5.

In the case where the pulse shift circuit 1 and the reference pulse circuit 2 are started at the same timing, in the section between the time t0 and the time t1, the values of AC1 and AC2 increase by the value of K for every clock and when the AC1 and the AC2 become equal to or larger than the value of M, PO1 (=1) and PO2 (=1) are outputted. In the section between the time t0 and the time t1, the pulse shift circuit 1 and the reference pulse circuit 2 output the frequency division number control signals (PO1 and PO2) at the same timing.

At the timing of t1, the addition bit generating circuit 5 of the pulse shift circuit 1 generates the addition bit AD1 according to the phase setting signal (PSD1) and outputs AD1 only during one clock. In FIG. 1, in the case where the relative phase of the output signal of the PLL 20 is needed to be advanced by X degrees with respect to the output signal of the PLL 21, on the basis of PSD1 set to X, the addition bit generating circuit 5 outputs the value AD1=X*M/360 to the adder 6. Then, the adder 6 adds K and AD1 and outputs the signal after the addition to the ΔΣ modulator 10. Because the integrator 12 of the ΔΣ modulator 10 integrates the output signal (K+AD1) of the adder 6, the value of AC1 increases by the value of K+AD1 at the timing of t1.

In the section after t2, the value of AC1 increases by the value of K for every clock, and when the value of AC1 becomes equal to or larger than the value of M, the pulse shift circuit 1 outputs PO1(=1).

As the result, AD1/K clock difference is created between the timing when PO1 (=1) is outputted and the timing when PO2 (=1) is outputted.

As described above, according to the pulse shift circuit of Embodiment 2, because the bit number (AD1) in accordance with the shift amount setting signal (PSD1) is added to K by using the adder 6, a shift of the frequency division number control signal can be made during one clock. Thus, the circuit's operation time can be reduced, bringing about an effect in reduction of a circuit's power consumption.

Figure 8:
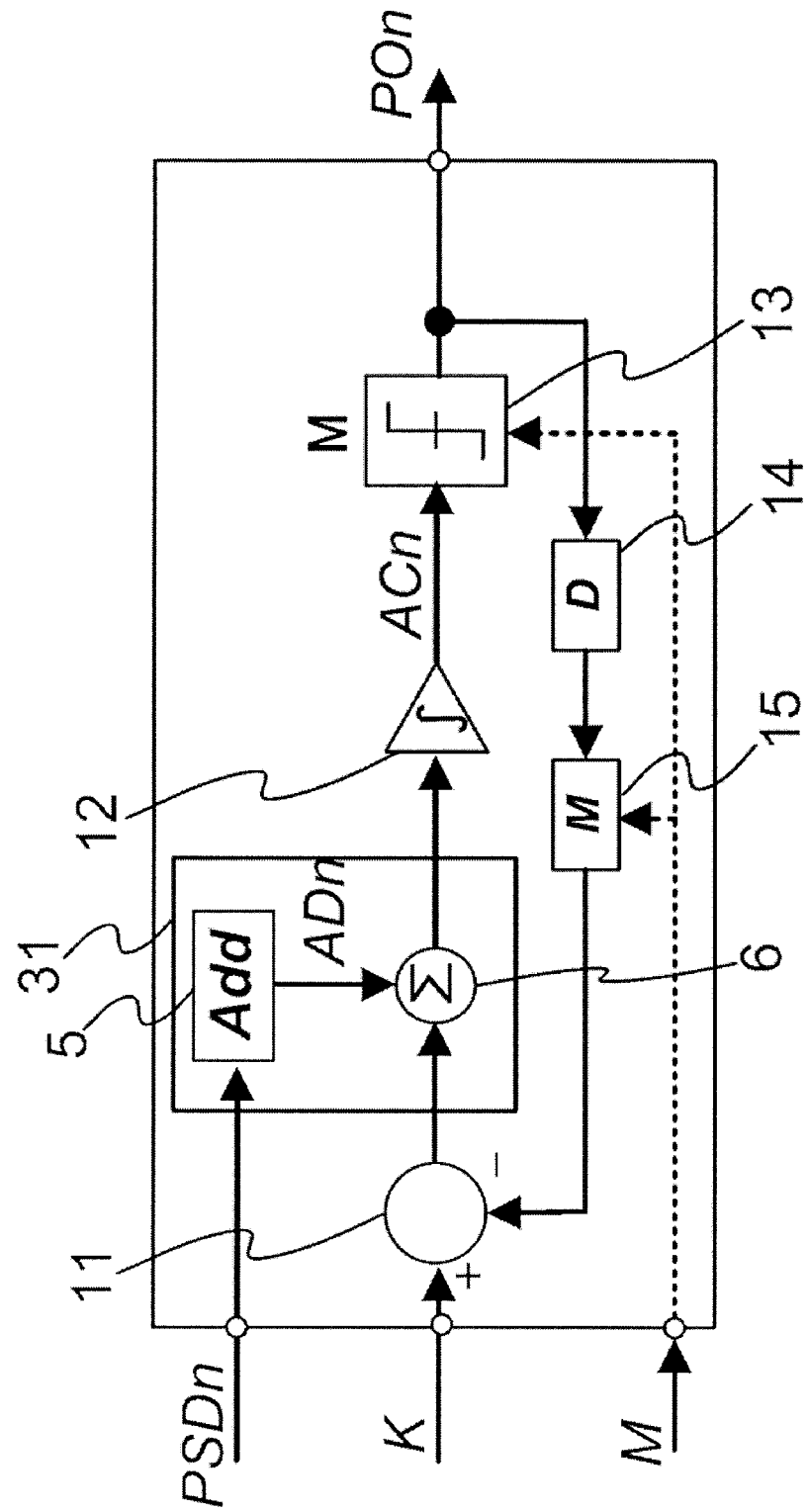
FIG. 8 is a diagram showing another configuration example of the pulse shift circuit according to Embodiment 2 of the present invention.

Note that the addition bit generating circuit 5 and the adder 6 may be provided inside the ΔΣ modulator 10. FIG. 8 is a diagram showing another configuration example of the pulse shift circuit according to Embodiment 2 of the present invention. As shown in FIG. 8, when a configuration is adopted in which the adder 6 is provided after the subtractor 11, because K+ADn is outputted to the integrator 12 by the operation of the adder 6, ACn is increased by the value of K+AD1, and thus the output timing of POn can be shifted by the increase. The pulse shift circuit with such a configuration as shown in FIG. 8 can also bring about the same effect as the pulse shift circuit shown in FIG. 6.

Embodiment 3

In Embodiment 1, a case where K of the pulse shift circuit is constant is described. Here, a case where K of the pulse shift circuit changes with time will be described. In this case, in an F-PLL, which generates frequency modulation signals (FM signals) such as a chirp signal, a pulse shift for phase difference control can be made.

Figure 9:
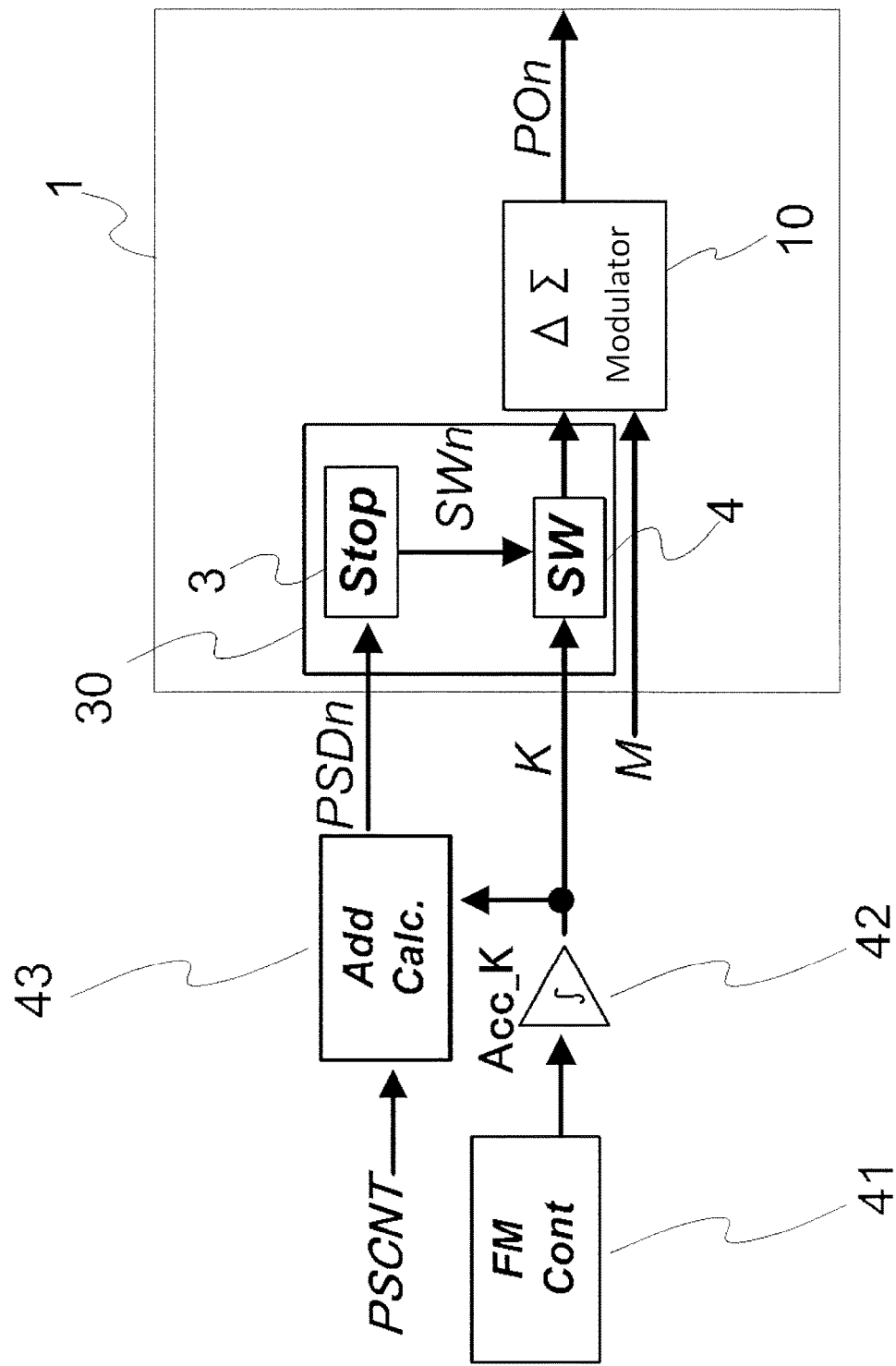
FIG. 9 is a diagram showing a configuration example of a pulse shift circuit according to Embodiment 3 of the present invention.

FIG. 9 is a diagram showing a configuration example of a pulse shift circuit according to Embodiment 3 of the present invention. The pulse shift circuit according to Embodiment 3 includes an FM control circuit 41, an integrator 42, and an addition circuit 43, in the input side of the pulse shift circuit 1 shown in FIG. 2 of Embodiment 1.

The FM control circuit 41 is an FM control circuit to output the differential value of K corresponding to the amount of frequency change in FM. For the FM control circuit 41, for example, a logic circuit of FPGA is used.

The integrator 42 integrates the differential value of K inputted from the FM control circuit 41 and outputs K obtained by the integration.

The addition circuit 43 is an addition circuit to generate a phase setting signal (PSDn) by using an externally inputted phase control signal (PSCNT) and K outputted from the integrator 42. For the addition circuit 43, for example, a logic circuit of FPGA, or an ASIC is used.

Next, operation of the pulse shift circuit according to Embodiment 3 will be described.

The FM control circuit 41 outputs the differential value of K corresponding to the amount of frequency change in frequency modulation. The integrator 42 generates K by integrating the differential value of K. When frequency modulation is carried out, K outputted from the integrator 42 to the switch 4 changes owing to the frequency modulation, while M is known and always constant. The addition circuit 43 generates a phase setting signal (PSDn) from an externally inputted phase control signal (PSCNT) and K outputted from the integrator 42. PSCNT has a value (K/M) after the decimal point in the division number regarding a frequency subjected to phase control and a change value (X degrees) of the relative phase at the frequency in the F-PLL under frequency modulation.

For example, in a case where the relative phase is needed to be delayed by X degrees when the F-PLL's output signal frequency becomes Y during frequency modulation such as a chirp modulation, the addition circuit 43 calculates a value after the decimal point in the division number of the F-PLL at each moment based on the integrated K value and the known M value, and outputs the X value as a PSDn signal at the timing when the value after the decimal point reaches K/M. The value M may be either stored in the addition circuit 43 or externally inputted.

If K and M to be inputted to the 4E modulator 10 are known, the information on the frequency of the signal outputted by the F-PLL can be obtained. Therefore, even in a case where K changes during the frequency modulation, the instantaneous frequency information can be obtained by monitoring K outputted from the integrator 42. As described above, the addition circuit 43 calculates the PSDn signal needed by the switch control circuit 3 based on frequency information obtained from the K value and a phase control requirement which is externally set by the PSCNT signal and outputs the PSDn signal.

The operation after the above is the same as those described in Embodiment 1, and thus the description is omitted.

As described above, according to the pulse shift circuit of Embodiment 3, because K is generated by integrating the differential value of K corresponding to the amount of frequency change, and then the phase setting signal (PSDn) is generated from the phase control signal (PSCNT) and K, a pulse shift needed for F-PLL's phase difference control can be made even during frequency modulation where K changes with time.

Figure 10:
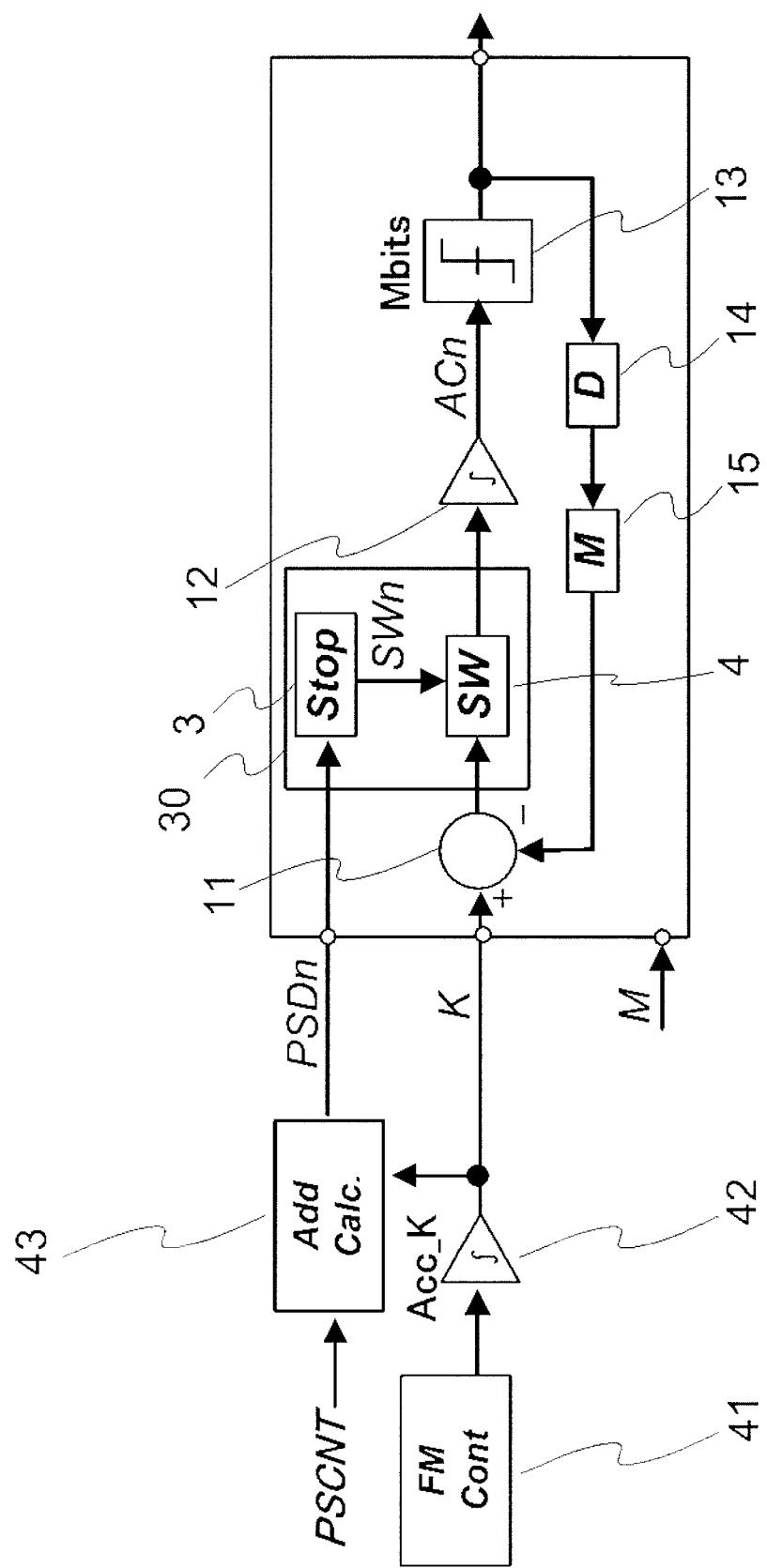
FIG. 10 is a diagram showing another configuration example of the pulse shift circuit according to Embodiment 3 of the present invention.

The input signal control circuit 30 may be provided inside the ΔΣ modulator 10 in the same manner as the pulse shift circuit 1 shown in FIG. 4 of Embodiment 1. FIG. 10 is a diagram showing another configuration example of the pulse shift circuit according to Embodiment 3 of the present invention. The difference from the pulse shift circuit shown in FIG. 9 is that the input signal control circuit 30 is provided inside the ΔΣ modulator 10. The pulse shift circuit with such a configuration as shown in FIG. 10 can also bring about the same effect as the pulse shift circuit shown in FIG. 9.

Figure 11:
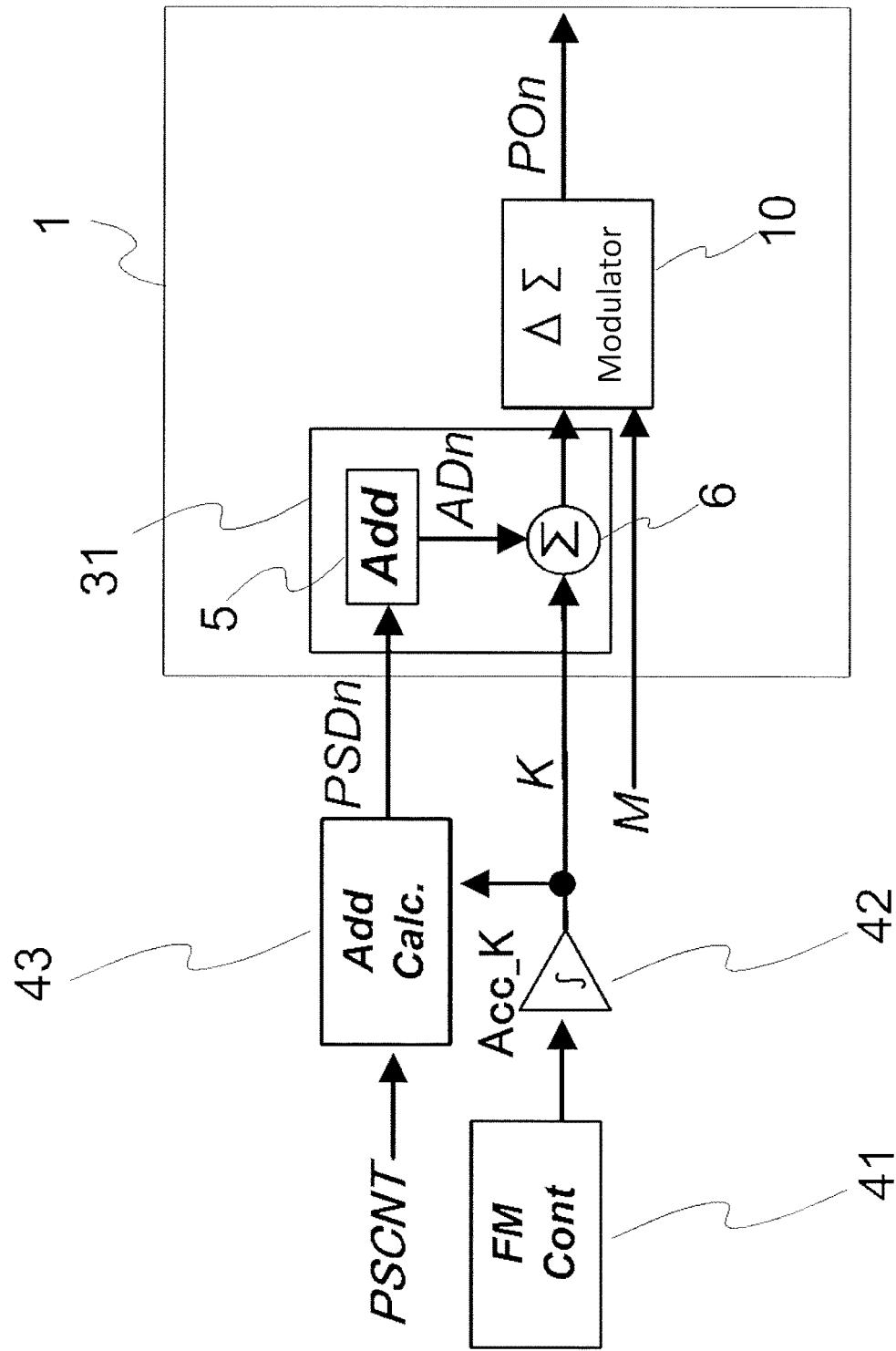
FIG. 11 is a diagram showing another configuration example of the pulse shift circuit according to Embodiment 3 of the present invention.

Further, a configuration is also possible in which the FM control circuit 41, the integrator 42, and the addition circuit 43 are provided in the input side of the pulse shift circuit 1 shown in FIG. 6 of Embodiment 2. FIG. 11 is a diagram showing another configuration example of the pulse shift circuit according to Embodiment 3 of the present invention. The difference from the pulse shift circuit shown in FIG. 9 is that the input signal control circuit 31 is constituted by the addition bit generating circuit 5 and the adder 6. The pulse shift circuit with such a configuration as shown in FIG. 11 can also bring about the same effect as the pulse shift circuit shown in FIG. 9.

Figure 12:
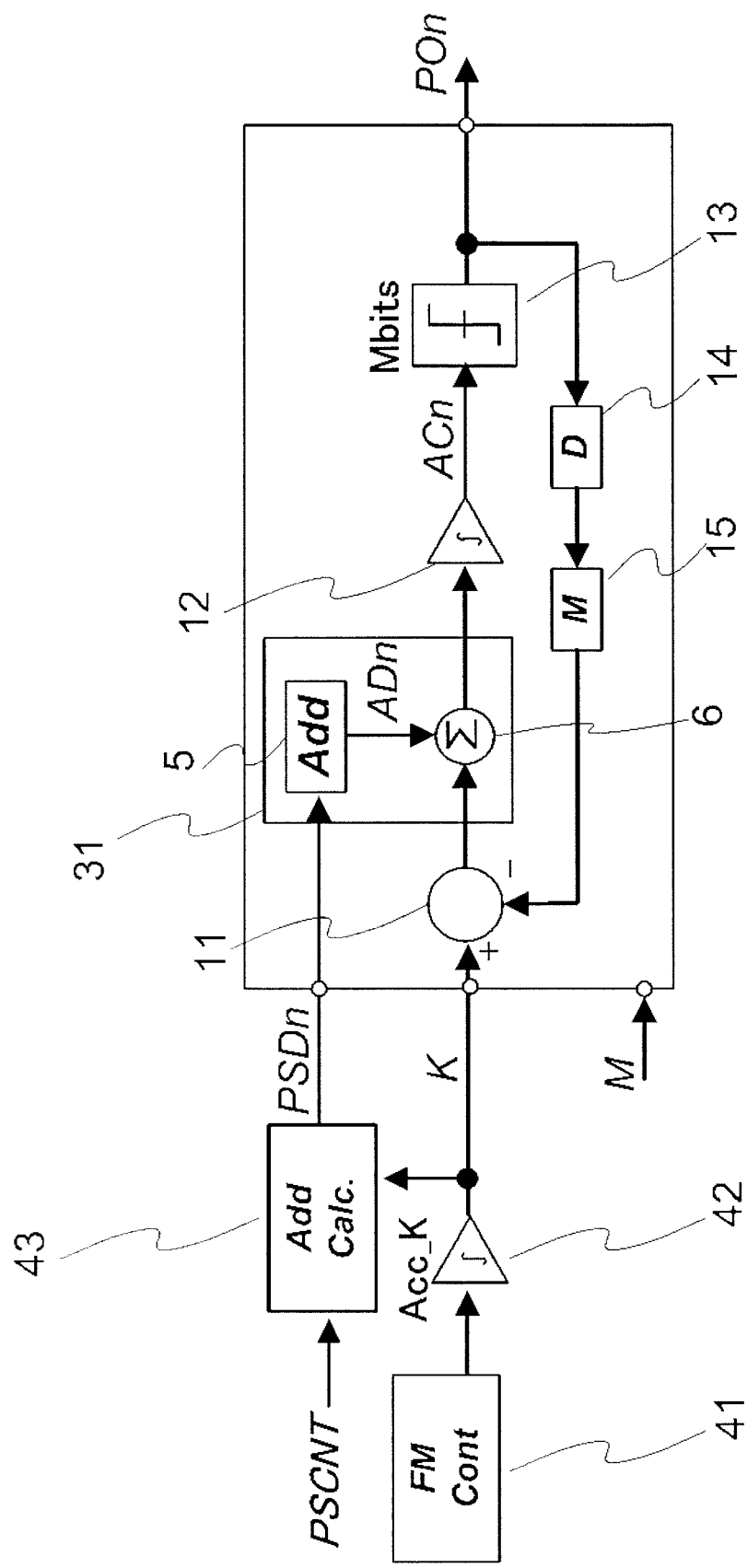
FIG. 12 is a diagram showing another configuration example of the pulse shift circuit according to Embodiment 3 of the present invention.

Further, similarly to the circuit shown in FIG. 8 of the Embodiment 2, a configuration is also possible in which the input signal control circuit 31 is provided inside the ΔΣ modulator 10. FIG. 12 is a diagram showing another configuration example of the pulse shift circuit according to Embodiment 3 of the present invention. The difference from the pulse shift circuit shown in FIG. 11 is that the input signal control circuit 31 is provided inside the ΔΣ modulator 10. The pulse shift circuit with such a configuration as shown in FIG. 12 can also bring about the same effect as the pulse shift circuit shown in FIG. 11.

DESCRIPTION OF SYMBOLS

1: pulse shift circuit
2: reference pulse circuit
3: switch control circuit
4: switch
5: addition bit generating circuit
6: adder
10: ΔΣ modulator
11: subtractor
12: integrator
13: quantizer
14: delay circuit
15: converter
30: input signal control circuit
31: input signal control circuit
41: FM control circuit
42: integrator
43: addition circuit

The invention claimed is:

1. A pulse shift circuit comprising:
an integrator to integrate, for every clock, a first signal to be inputted;
a quantizer to receive a second signal and to output a pulse signal when an integrated value of the integrator becomes equal to or larger than a signal value of the second signal;
a delay circuit to delay the pulse signal;
a converter disposed before or after the delay circuit to convert a signal value of the pulse signal into a signal value of the second signal;
a subtractor to subtract the signal value of the pulse signal which is converted by the converter and is directly received from the converter, from a signal value of the first signal to be inputted to the integrator; and
an input signal control circuit to receive a third signal, to be disposed before the integrator, and to add a signal value corresponding to the third signal to the first signal to be inputted to the integrator or to block the first signal from being inputted to the integrator for clocks corresponding to the third signal.

2. The pulse shift circuit according to claim 1, wherein the input signal control circuit is an adder to add to the first signal inputted to the integrator, a signal value corresponding to a shift amount with respect to a reference pulse signal having a same cycle as the pulse signal outputted by the quantizer.

3. The pulse shift circuit according to claim 1, wherein the input signal control circuit is a switch to block the first signal from being inputted to the integrator for clocks corresponding to a shift amount with respect to a reference pulse signal having a same cycle as the pulse signal outputted by the quantizer.

4. A frequency synthesizer comprising:
an integrator to integrate, for every clock, a first signal to be inputted;
a quantizer to receive a second signal and to output a pulse signal when an integrated value of the integrator becomes equal to or larger than a signal value of the second signal;
a delay circuit to delay the pulse signal;
a converter to convert a signal value of the pulse signal delayed by the delay circuit into a signal value of the second signal;
a subtractor to subtract the signal value of the pulse signal converted by the converter, from a signal value of the first signal to be inputted to the integrator;
an input signal control circuit to receive a third signal, to be disposed before the integrator, and to add a signal value corresponding to the third signal to the first signal to be inputted to the integrator or to block the first signal from being inputted to the integrator for clocks corresponding to the third signal;
a reference pulse circuit to output a reference pulse signal having a same cycle as the pulse signal outputted by the quantizer;
a first phase synchronization circuit provided with a divider to determine a division number from the pulse signal; and
a second phase synchronization circuit provided with a divider to determine a division number from the reference pulse signal.

5. The pulse shift circuit according to claim 1, further comprising:
an FM control circuit to output a differential value corresponding to the amount of frequency change in frequency modulation;
a second integrator to integrate the differential value and to output the integrated differential value as the first signal; and
an addition circuit to receive a fourth signal which is a phase control signal, to generate the third signal from the differential value integrated by the second integrator and the fourth signal, and to output the generated third signal to the input signal control circuit.

* * * * *